United States Patent
Cappelli et al.

(10) Patent No.: US 7,193,437 B2
(45) Date of Patent: Mar. 20, 2007

(54) ARCHITECTURE FOR A CONNECTION BLOCK IN RECONFIGURABLE GATE ARRAYS

(75) Inventors: Andrea Cappelli, Faenza (IT); Luca Ciccarelli, Rimini (IT); Andrea Lodi, Castel S. Pietro (IT); Mario Toma, Bologna (IT); Fabio Campi, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 398 days.

(21) Appl. No.: 10/778,913

(22) Filed: Feb. 13, 2004

(65) Prior Publication Data

US 2004/0225980 A1 Nov. 11, 2004

(30) Foreign Application Priority Data

Feb. 14, 2003 (IT) .......................... MI2003A0276

(51) Int. Cl.
*H03K 19/177* (2006.01)
*H01L 25/00* (2006.01)
*G11C 11/00* (2006.01)
*G11C 7/10* (2006.01)

(52) U.S. Cl. .............................. 326/41; 326/37; 326/38; 326/39; 326/40; 326/47; 365/154; 365/156; 365/189.05; 365/189.11; 716/16

(58) Field of Classification Search ............ 326/37–41, 326/47, 105, 113; 365/154, 156, 230.05, 365/189.05, 189.11
See application file for complete search history.

(56) References Cited

U.S. PATENT DOCUMENTS

| | | | | |
|---|---|---|---|---|
| 5,130,704 A * | 7/1992 | Ogawa et al. | ............... | 345/204 |
| 5,801,551 A * | 9/1998 | Lin | ............................ | 326/113 |
| 5,808,933 A * | 9/1998 | Ross et al. | .................. | 365/156 |
| 6,265,895 B1 * | 7/2001 | Schleicher et al. | ........... | 326/40 |
| 6,617,912 B1 * | 9/2003 | Bauer | ......................... | 327/408 |
| 6,768,335 B1 * | 7/2004 | Young et al. | ................. | 326/37 |
| 6,804,143 B1 * | 10/2004 | Hobson | ...................... | 365/154 |
| 2002/0071305 A1 * | 6/2002 | Lu et al. | ..................... | 365/154 |
| 2004/0212395 A1 * | 10/2004 | Madurawe | ................... | 326/39 |
| 2005/0058003 A1 * | 3/2005 | Yamada | ................. | 365/230.05 |

OTHER PUBLICATIONS

Lodi, A.; Ciccarelli, L.; Cappelli, A.; Campi, F.; Toma, M. ☐☐Decoder-based interconnect structure for multi-context FPGAs, pp. 362-364 ☐☐IEEE Xplore, vol. 39 Issue:4 Feb. 20, 2003 ☐☐.*

(Continued)

*Primary Examiner*—Rexford Barnie
*Assistant Examiner*—Dylan White
(74) *Attorney, Agent, or Firm*—Lisa K. Jorgenson; E. Russell Tarleton; Seed IP Law Group PLLC

(57) ABSTRACT

An optimized architecture to implement connections between logic blocks and routing lines in reconfigurable gate arrays including connection blocks to connect inputs and outputs of different logic elements by means of connection wires, each connection block including a single line of pass transistor switches; and a decoding stage to drive the pass transistor switch.

23 Claims, 6 Drawing Sheets

OTHER PUBLICATIONS

Maestre, R.; Fernandez, M.; Kurdahi, F.J.; Bagherzadeh, N.; Singh, H. Configuration management in multi-context reconfigurable systems for simultaneous performance and power optimizations System Synthesis, 2000. Proceedings. The 13th International Symposium on 2000, pp. 107-113, no month.*

Lodi, A.; Ciccarelli, L.; Cappeli, A.; Campi, F.; Toma, M. Decoder-based multi-context interconnect architecture, pp. 231-233 VLSI, 2003. Proceedings. IEEE Computer Society Annual Symposium on Feb. 20-21, 2003.*

Weisheng Chong; Ogata, S.; Hariyama, M.; Kameyama, M. Architecture of a Multi-Context FPGA Using Reconfigurable Context Memory, pp. 144a-144a Parallel and Distributed Processing Symposium, 2005. Proceedings. 19th IEEE International Apr. 4-8, 2005.*

* cited by examiner

ARCHITECTURE FOR A CONNECTION BLOCK IN RECONFIGURABLE GATE ARRAYS

BACKGROUND OF THE INVENTION

1. Field of the Invention

The present invention relates to an architecture for a connection block in reconfigurable gate arrays and, in particular, to an architecture for reprogrammable interconnections of multi-context Programmable Gate Arrays (PGA) to implement connections between logic blocks and routing lines in reconfigurable gate arrays including connection blocks to connect inputs and outputs of different logic elements by means of connection wires.

2. Description of the Related Art

As is well known in this specific technical field, various architecture and circuit solutions have been proposed to implement the connection between routing lines and logic blocks in Programmable Gate Arrays.

To reduce the overload due to the processing time, multi-context reconfiguration architectures have been recently proposed to store some configurations in the array allowing context switchings in a very short time.

However this approach has some drawbacks: each SRAM cell used to store configuration bits must be repeated as many times as the contexts.

Most of the area occupation is due to the high number of SRAM memories allocated in the array, in particular those being used to determine which routing switchings must be activated to reach the desired connectivity between the logic blocks.

On the other hand the technology miniaturisation leads to programmable interconnections being responsible for most of the area occupation and of the delay. Therefore interconnections are an increasingly important key requirement for reprogrammable architectures, wherein devices like pass transistors, tristate buffers or multiplexers increase the area occupation and the capacitive load on wires and connectors, affecting the overall performance.

New solutions to optimise programmable interconnections are thus necessary to remove this difficulty.

FIG. 1 shows a typical programmable interconnection structure for reconfigurable gate arrays, in particular with reference to connection blocks, that implement the connection of inputs and outputs of different logic elements by means of connection wires.

This basic solution has been proposed by Kerry M. Pierce et al. in U.S. Pat. No. 5,760,604 granted on Jan. 3, 1996 (assigned to Xilinx, Inc.) and concerning an "Interconnect architecture for field programmable gate-array".

This first solution provides the connection of each logic block input or output line by means of routing wires using switches formed by n-MOS pass transistors and a configuration cell memory enabling or disabling the connection. This choice requires a large silicon area, particularly in a multi-context structure.

The multiplexing diagram shown in FIG. 5a of U.S. Pat. No. 5,760,604 is the previously described switching structure. Only a switch is enabled for the connection of the output line corresponding to the logic block by means of an outer routing wire.

Some other circuit solutions have been used to connect wires using a CMOS transfer gate instead of a n-MOS pass transistor to preserve a high logic value of the signals, or arranging buffers before switches to improve the signal transmission rate.

However all these solutions require several configuration memory cells used to enable or disable switches.

FIG. 2 shows a sub-structure of a connection block. This traditional implementation refers to a line belonging to a connection block and it shows the high number or multi-context memories being required.

The area occupation highly depends on n, which is the vertical routing bus amplitude. However this solution is the ideal solution as for performance times since only one pass transistor passes through and in a connection block.

This second prior art solution has been described in U.S. Pat. No. 6,134,173 granted on Nov. 2, 1998 to R. G. Cliff, L. T. Cope, C. R. McClintock, W. Leong, J. A. Watson, J. Huang, B. Ahanin (assigned to Altera Corporation) and concerning a "Programmable logic array integrated circuit".

Several detailed proposals to realize connection blocks have been disclosed by Richard G. Cliff et al, in the above-mentioned second patent.

While the connection block structure is quite similar to the above-described block (see FIG. 5 of the patent), an alternative diagram based on a multiplexing stage is also proposed. For example, the architecture shown in FIGS. 6–8 of U.S. Pat. No. 6,134,173 duplicates the input line, using a single memory cell to enable to switches located on two different wires. One of the two output wires can be selected by a multiplexer, thus programming a memory cell.

This diagram allows the number of programming cells to be reduced, but it increases the delay since the signal must pass through a switch and a multiplexer. A further alternative connection is proposed by using only a multiplexer (FIG. 7 of U.S. Pat. No. 6,134,173). In this case the connection between the logic block wire and the routing wire is fixed and a multiplexer connects the correct signal.

This structure minimizes the configuration memory cells but the signal has a delay depending on the multiplexer architecture and size. The last alternative architecture proposed by U.S. Pat. No. 6,134,173 is shown in FIG. 9 thereof wherein the output of a single multiplexer is connected to some logic blocks by means of a switch.

This diagram minimizes the number of multiplexers but it increases the signal delay, since it is necessary to pass through two stages.

Two similar multiplexer structures to be used for designing connection blocks are described in the following pages.

1) P. Chow, S. Seo, J. Rose, K Chung, G. Paez, I. Rahardja "The Design of a SRAM-Based Field Programmable Gate Array, Part 11: Circuit Design and Layout" in IEEE Transactions on Very Large Scale Integration (VLSI) Systems, Volume: 7, Published on: Sep. 3, 1999, pages: 321–330 and, 2) V. Baena-Lecuyer, M. A. Aguirre, A. Torralba, L. G. Franquelo, J. Faura "Decoder driven switching matrices in multicontext fpgas: area reduction and their effect on routability" In Proceedings of the 1999 IEEE International Symposium on Circuits and Systems. ISCAS'99, volume 1, pages 463–466, 1999

FIG. 3 of the first article and FIG. 2 of the second article show two multiplexer structures for minimizing the area occupation due to configuration memories.

These solutions simultaneously add a delay in the signal transmission and they do not require both control signal (true value and the opposite thereof) stored in each memory cell, the complete signal oscillation is limited by the transistor electric threshold on both high and low values.

On the other hand the first solution uses only n-MOS pass transistors (see FIG. 3), so that the complete signal oscillation is limited only on a high value, but it requires both control signals, provided by each memory cell to drive the switches accordingly. Therefore a level-shifter buffer is required at the end of the connection block in order to recover the electric threshold.

BRIEF SUMMARY OF THE INVENTION

The disclosed embodiments of the present invention provide an architecture effective to combine area reduction and ideal speed performance for programmable interconnections in Programmable Gate Arrays, and considerable advantages are achieved in the case of multi-context architectures.

In accordance with one embodiment of the invention, a decoding stage is inserted between memories, containing information about the connectivity in connection blocks and pass transistors switches in order to considerably reduce the area occupation without affecting the latency of the signals passing through the programmable interconnections. The design thus provides an ideal compromise between the typical approach for connection block programmable interconnections and a multiplexer structure.

According to an embodiment of the invention a circuitry is provided for implementing connection blocks in programmable gate arrays, more particularly for implementing connections between logic blocks and routing lines in reconfigurable gate arrays comprising connection blocks to connect inputs and outputs of different logic elements by means of connection wires, wherein each connection block comprises a single line of pass transistor switches and a decoding stage to drive said pass transistor switches.

According to a further embodiment of the invention, a circuit architecture to implement connections between logic blocks and routing lines in reconfigurable gate arrays is provided. The circuit includes connection blocks configured to connect inputs and outputs of different logic elements by means of connection wires, each connection block having a single line of pass transistor switches, and further including a decoding stage to drive the pass transistor switches.

In accordance with another embodiment of the invention, a connection block for reconfigurable gate arrays is provided, the connection block includes a plurality of connection wires coupled to an output of the logic block and each wire coupled to a respective routing line, each wire including a single pass transistor switch having a control terminal; and a decoding stage having a plurality of outputs, each output coupled to a respective pass transistor switch control terminal to drive the pass transistor switch and selectively couple the logic block to at least one of the routing lines.

In accordance with another embodiment of the invention, a memory architecture is provided, that includes a plurality of SRAM memory cells; at least one logic block; a plurality of routing lines; a connection block coupled between the at least one logic block and the plurality of routing lines, the connection block comprising a plurality of wires coupled to an output of the at least one logic block and each of the plurality of wires coupled to a respective routing line, the connection block further comprising a pass transistor switch in each connection wire for selectively coupling the at least one logic block to a respective routing line, the pass transistor switch including a control terminal; a decoding stage having a plurality of decoding outputs, each decoding output coupled to the control terminal of a respective pass transistor switch to drive the pass transistor switch.

BRIEF DESCRIPTION OF THE DRAWINGS

The features and advantages of the architecture according to this invention will be apparent from the following description of the best embodiment of the invention given by way of non-limiting example with reference to the attached drawings.

DETAILED DESCRIPTION OF THE INVENTION

Figure 4:
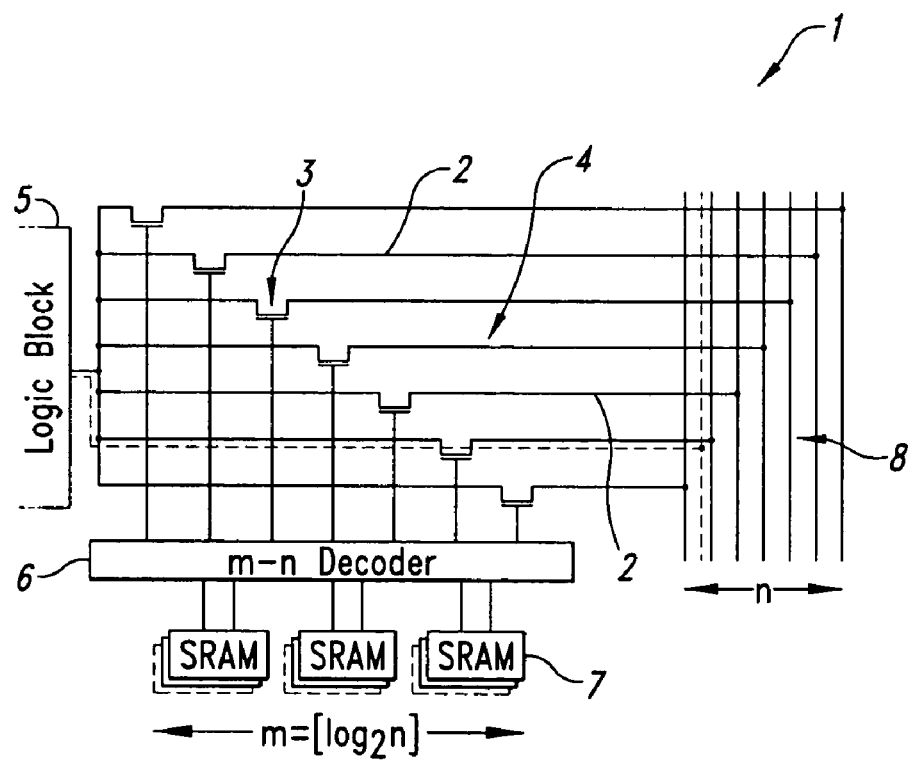
FIG. 4 is a block diagram of a decoding architecture for programmable interconnections of multi-context Programmable Gate Arrays (PGA) according to the present invention.

With reference to the above drawings, a Multi-context Decoding Interconnection Architecture 1 based on the present invention is shown in FIG. 4. The architecture 1 will be called hereafter "Multi-context Decoding Interconnection Architecture (DBM).

A single line 2 of pass transistors switches 3, belonging to a connection block 5 of the configurable gate array, is shown in FIG. 4. A dedicated decoding stage 6 has been inserted to determine which pass transistor switch must be activated. SRAM cells 7 are thus conserved as little as possible since they must be repeated as many times as the contexts. In the case of a line (input or output of a logic block) which might be connected to one of the other wires n, m=k $\lceil \log_2 n \rceil$ memory cells are required, where k is the number of contexts and n is the amplitude of the vertical routing channel 8.

Decoder Diagram

The structure of the decoder 6 is particularly critical, The additional area occupation should not offset the reduced number of multi-context memories. A decoder 6, configured to provide for a minimum area occupation rather than for a time optimisation, is represented in the diagram. The latency of the decoder 6 is not a critical parameter since it occurs just after the switching from one context to the other and does not to affect the critical path and the overall performance.

Figure 5:
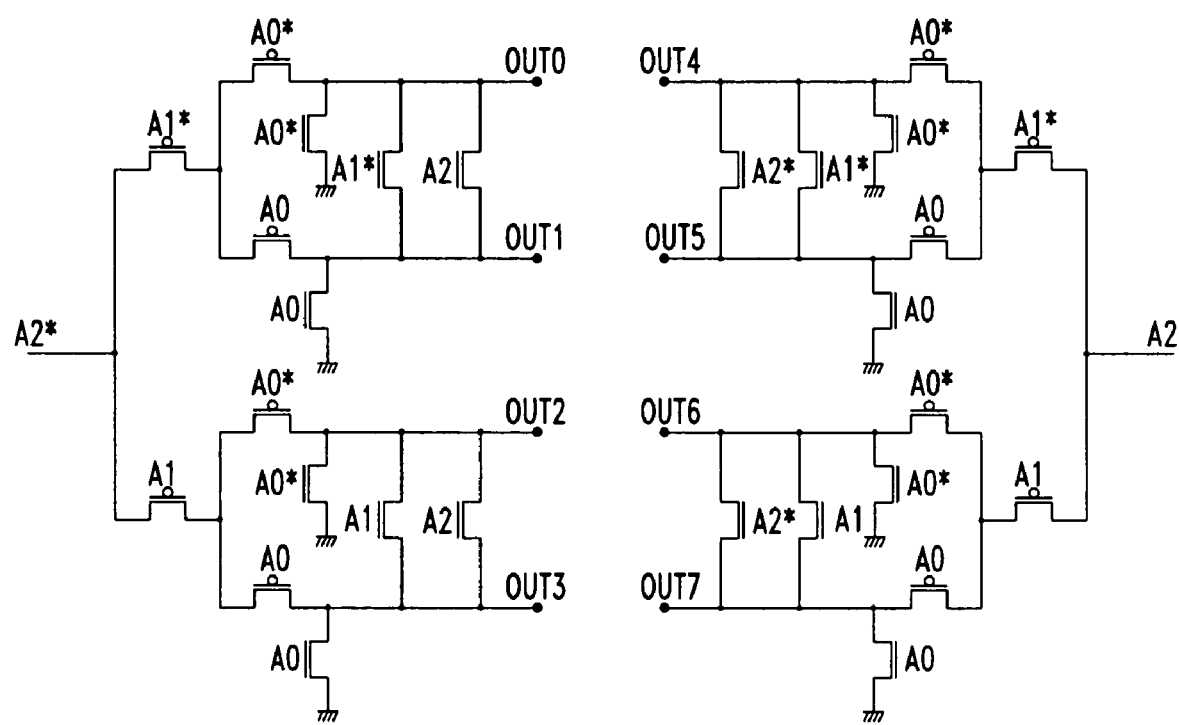
FIG. 5 is a block diagram of the diagram of a decoder incorporated in the Gate Array of FIG. 4.

A schematic view of the decoder 6 according to the present invention is shown in FIG. 5 wherein all transistors are small-sized. A similar diagram can obviously be obtained for any number n of lines to be connected. The structure of the decoder 6 is based on a p-MOS tree, minimising the number of transistors in the pull-up network, and a n-MOS pull-down network.

In prior art diagrams most of the area occupation is due to the pull-down network, which is composed of the parallel to n-MOS transistors m=k $\lceil \log_2 n \rceil$ for each decoder output.

On the contrary, in the solution of the invention the decoder outputs OUT0, OUT1, . . . , OUT7 are connected two by two with m-1 pass transistors, so that only one additional n-MOS transistor is required as a pull-down circuit for each output.

The following table 1 shows the total number of transistors that are required when a traditional pull-down network is used and in the case of the proposed solution for typical decoder sizes. It is clearly shown that a considerable improvement is achieved.

Table 1 below quotes the number of transistors required for different decoder sizes with the diagram of the invention and with known solutions.

|  | Traditional | DBM |
| --- | --- | --- |
| dec 3:8 | 36 | 28 |
| dec 4:16 | 92 | 68 |
| dec 5:32 | 220 | 156 |
| dec 6:64 | 508 | 316 |

It must be noted that the choice of a p-MOS pull-up tree minimises the number of p-MOS transistors and it provides correct outputs for the direct drive of n-MOS switches 3. The proposed diagram could obviously suffer from long latencies, especially on the emerging output edge, when the number of p-MOS series transistors must be passed through but, as above-mentioned, latency is not a critical problem for this decoder.

Multi-Context Memory Cell

Figure 6:
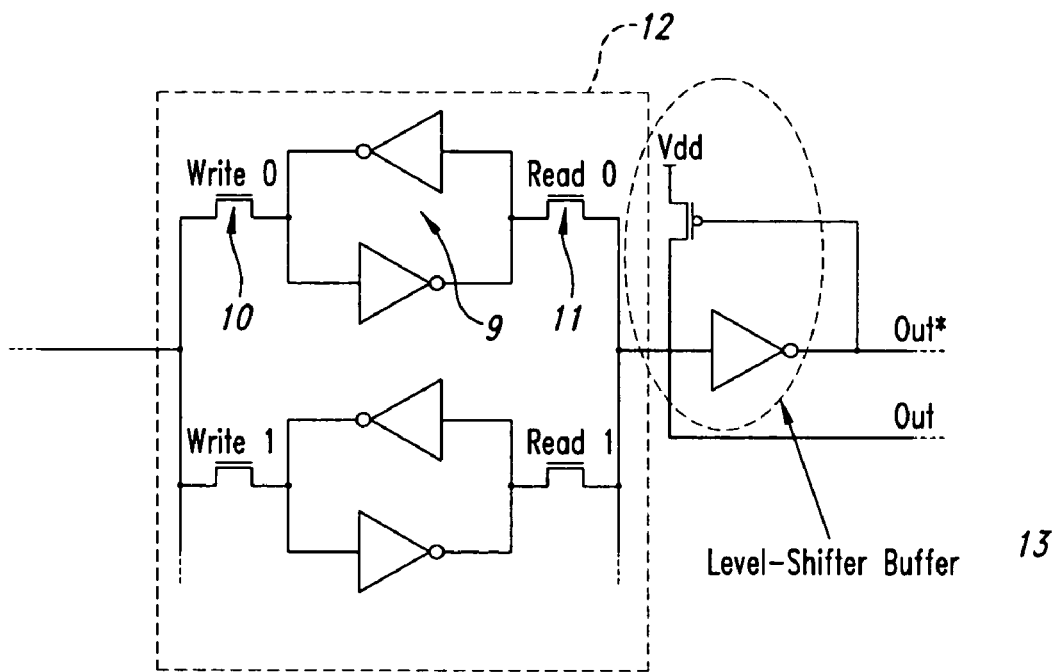
FIG. 6 shows multi-context memory cells with an output level-shifter buffer.

Since the memory area becomes larger and larger as the number of contexts increase, a memory cell structure with a minimum silicon area occupation has been implemented. A RAM static cell 12 has been used as the most effective choice for minimising the transistor importance and for supporting multi-context functions, as shown in FIG. 6.

The basic SRAM cell 12 has only one n-MOS pass transistor 10 for writing data, another transistor 11 for reading and a bistable element 9 for storing data. Therefore, when more cells 12 are interconnected for a multi-context memory, each SRAM cell 12 can be written while another cell is read, lending a high reconfiguration flexibility in a multi-context processing.

A basic circuit thus comprises six transistors: five transistors thereof have a minimum size, while only the n-MOS transistor 10 is used for writing purposes and it must be larger. At the end of the reading line a single level-shifter buffer 13 has been added to recover an electric threshold and to provide both true and complementary values to feed the following decoding stage, not shown.

Performance Analysis

Figure 1:
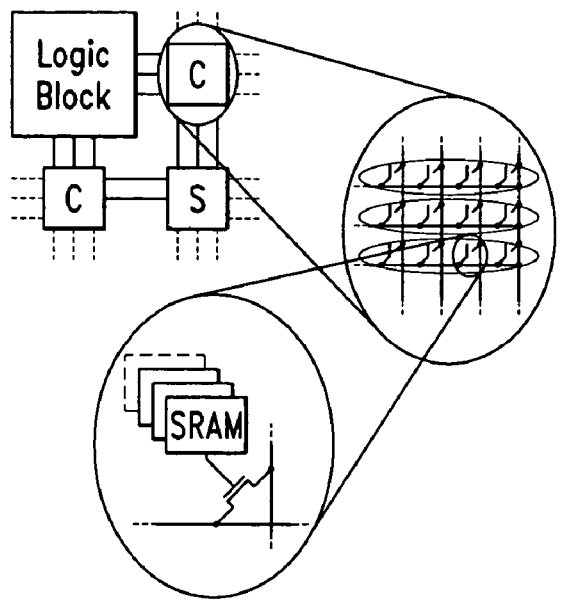
FIG. 1 schematically shows programmable interconnections for a typical reconfigurable Gate Array.
Figure 2:
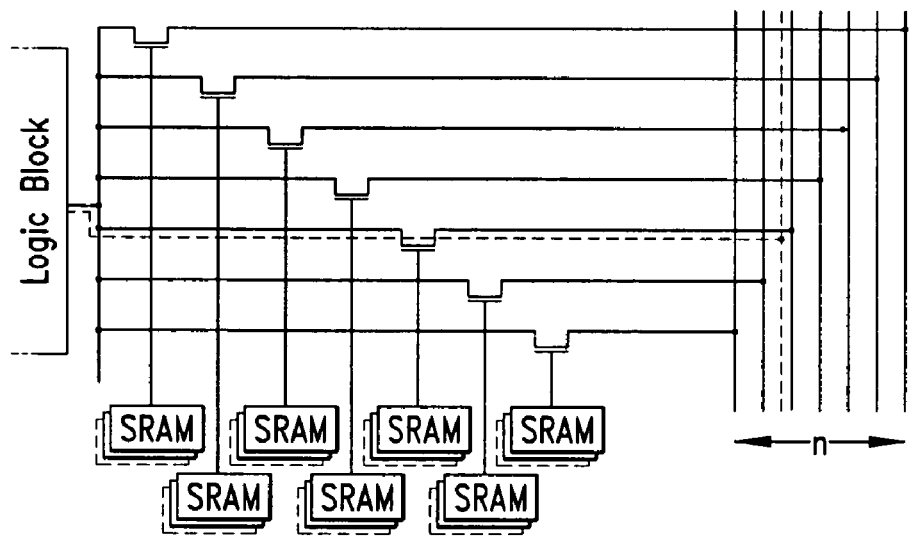
FIG. 2 shows a typical connection block sub-structure incorporated in a reconfigurable Gate Array.

The evaluation of the interconnection structure DBM according to the invention should take into account performance times and power consumption besides area occupation, being the key requirement. Comparisons between delays and power dissipation makes sense only with respect to the multiplexing tree structure, since DBM interconnections provide the same performances as the typical approach shown in FIG. 2. The performance evaluation has been carried out by the Applicant using a 1.8 V, 0:18 μm technology.

Figure 7:
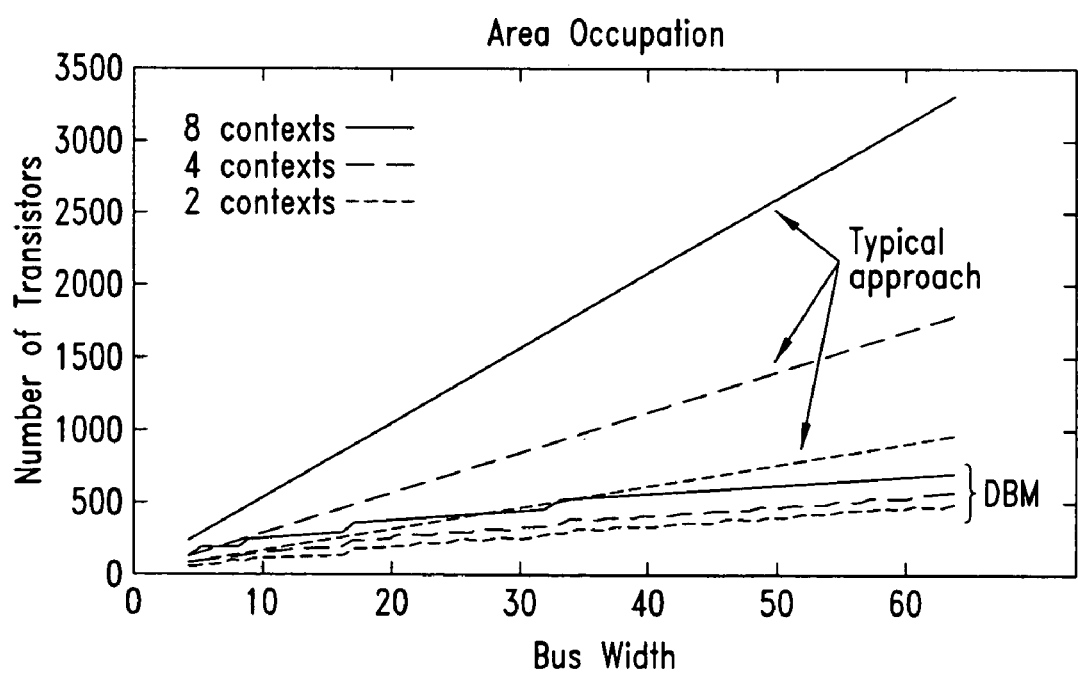
FIG. 7 is a comparison diagram between the area occupation of the architecture according to the invention and prior art solutions.

FIG. 7 shows the area occupation required to provide connectivity between a line and all the wires in a routing channel for the typical implementation and the DBM solution. The different curves show the number of transistors required as a function of the routing channel amplitude, for different numbers of contexts. The phases in the curves related to the DBM diagram occur in correspondence with bus amplitudes being a power of two; in these points the depth of the decoding tree must be increased and more memories are required.

Figure 8:
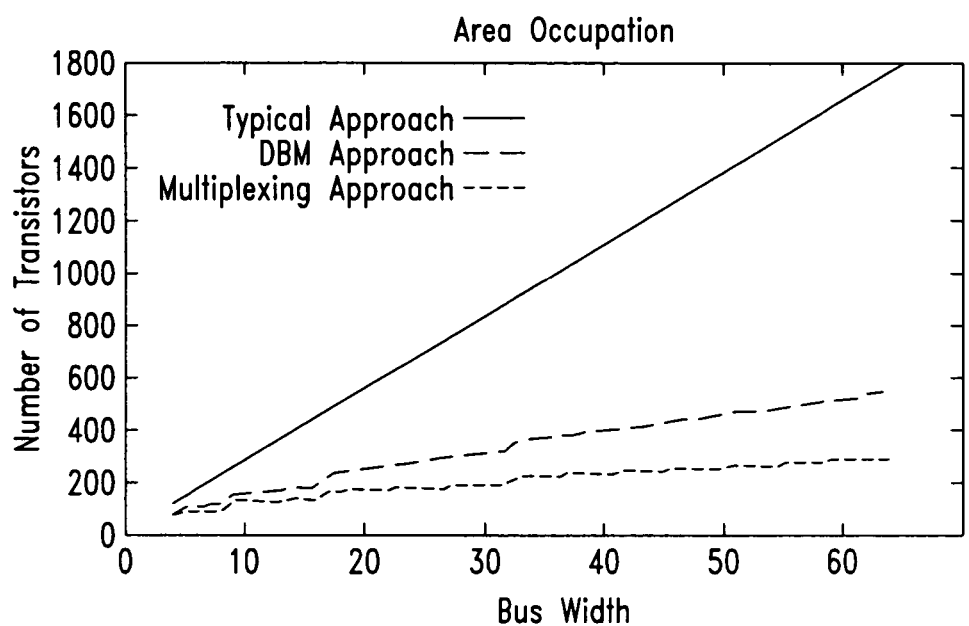
FIG. 8 is a further comparison diagram between the area occupation of the architecture according to the invention and another prior art solution.

As shown in FIG. 7 the area reduction is considerable, especially with a high number of contexts or a large bus: 60% and 70% respectively for contexts 4 and 8. A comparison between the DBM approach and the multiplexing tree approach is shown in FIG. 8, which supposes a number of contexts equal to 4, being the typically used value in most FPGAs. The area occupation of the multiplexing tree structure is smaller than the DBM, but if the bus is not very large, the reachable reduction is less than 30%.

Performance Times

Figure 3:
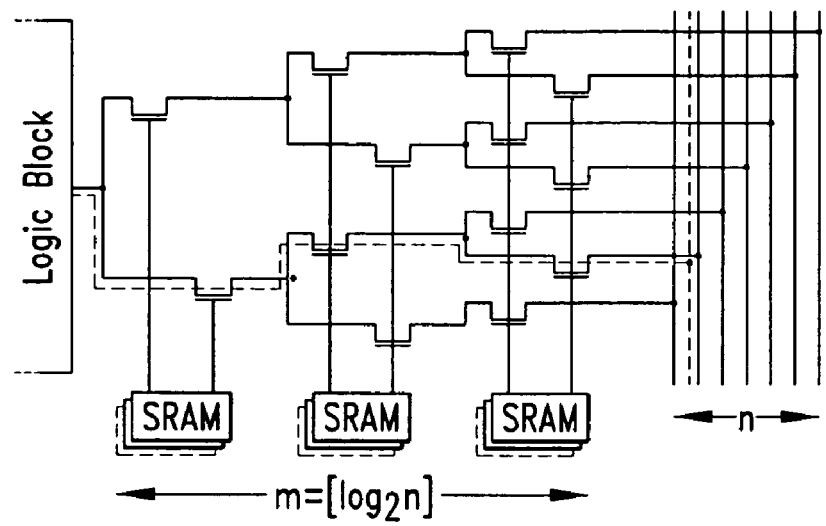
FIG. 3 shows the structure of a multiplexing tree for interconnections according to the prior art.
Figure 9:
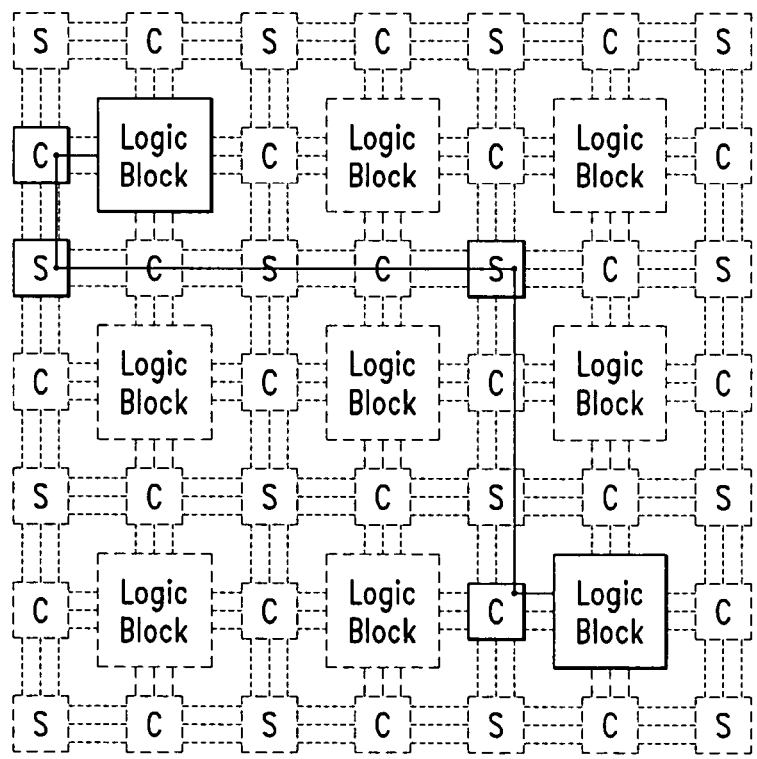
FIG. 9 schematically shows a connection path between two logic block of the Gate Array architecture according to the invention.

The evaluation of the DBM structure from the performance time point of view is carried out by comparing the delays thereof with the multiplexing tree approach delays inserting, as shown in FIG. 3, a series of pass transistors. For a delay estimate, a reference path connecting two logic blocks has been chosen. The path is shown in FIG. 9 and it passes through a number of switching blocks and connection blocks. Interconnection structures in the evaluation step have been applied only to connect blocks, and convenient buffers have been inserted in the lines in correspondence with switching blocks. A correct comparison of the delays of different structures can thus be carried out, independent from the routing architecture of the switching block.

Figure 10:
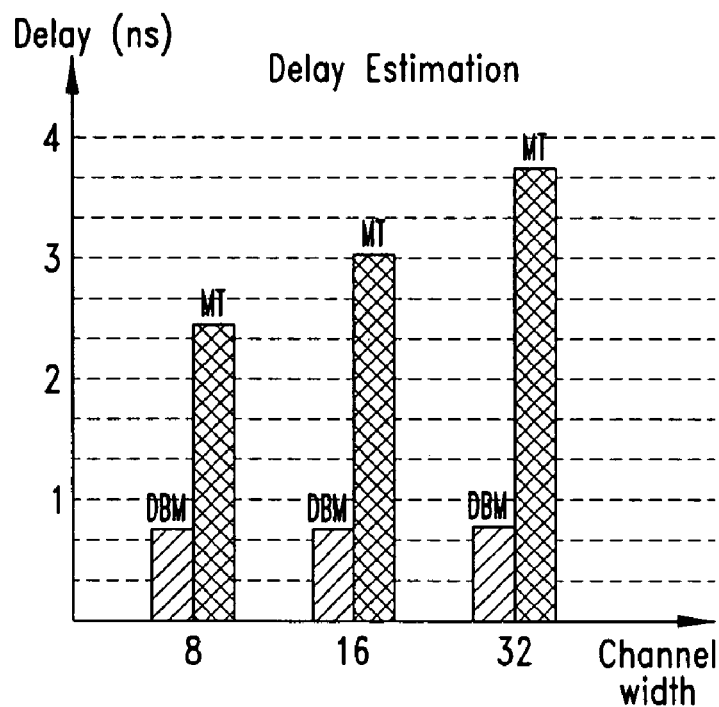
FIG. 10 is a diagram showing the delay estimation for the solution according to the invention and the known structure of the multiplexing tree (MT) of FIG. 3.

Buffering stages, especially in the case of multiplexing tree connections, are used in order to avoid incomplete transitions and not enough sharp edges. FIG. 10 shows delays associated with the path being described as a function of the routing channel amplitude. In this case it is supposed that an input/output line towards/from a logic block can be connected to all the wires in a routing channel. The number of contexts does not affect the latency, except for the area and connection length increase, because of a high number of configuration memories.

Results clearly show that the multiplexing tree approach is seriously affected by a series of pass transistors having delays more than three times higher than DBM delays. On the other hand the delays in the DBM architecture are the same as a typical FPGA diagram (see FIG. 2) and almost independent from the routing channel amplitude.

Power Consumption

The use of a long series of pass transistors, with many buffering stages as in the case of multiplexing tree interconnections, can result in an increase in power consumption. In fact, pass transistors cannot generate sharp edges, and this results in the slow gate switching, producing power dissipation.

Figure 11:
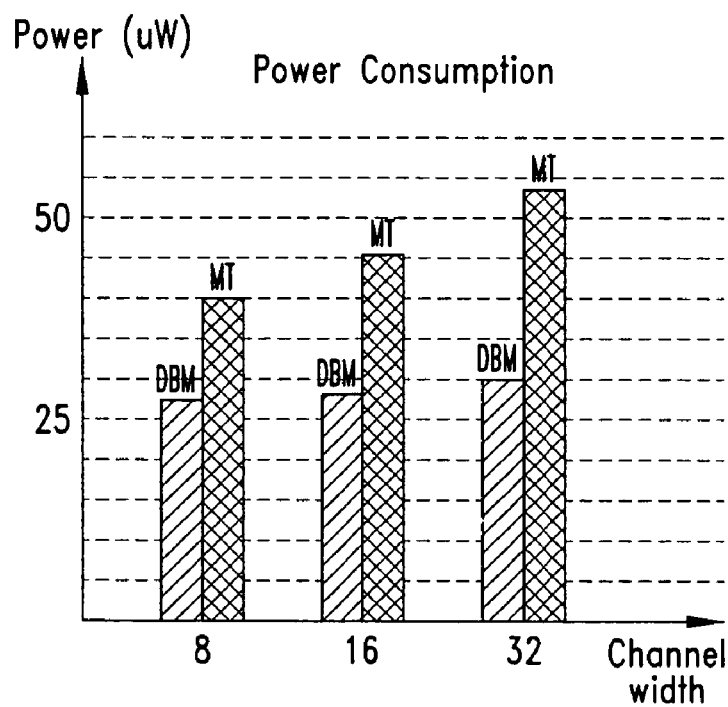
FIG. 11 is a further diagram showing the power estimation for the solution according to the invention and the known structure of the multiplexing tree (MT) of FIG. 3.

In order to evaluate the power dissipation, the same path used for the time analysis must be considered, supposing a clock frequency of 50 MHz. The power consumption of all buffers along the path has been estimated and taken into account. FIG. 11 shows the results, and it can be seen that the DBM approach allows a considerable power reduction up to 40% with respect to the multiplexing tree diagram.

According to the above description, the invention achieves a plurality of advantages that can be summarised in the following features:

Area reduction: The Multi-context Decoding Interconnection Architecture ensures a considerable area reduction, related to configuration memories, whose number is considerably reduced in this solution.

Latency optimisation: The Multi-context Decoding Interconnection Architecture ensures a minimum latency, since the number of switchings being passed through is the lowest.

Power consumption: The optimisation of the number of switchings being passed-through ensures less sharp slopes of the signals being transmitted from a logic element to another.

This ensures a considerable power saving due to faster signal transitions.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A circuit architecture to implement connections between logic blocks and routing lines in multi-context reconfigurable gate arrays, comprising: connection blocks to connect inputs and outputs of different logic elements in a multi-context reconfigurable gate array by means of connection wires, wherein each connection block comprises a single line of pass transistor switches and a decoding stage to drive said pass transistor switch, said decoding stage having a pull-up p-MOS transistor network and a n-MOS pull-down network, said pull-up transistor network comprising a p-MOS tree minimizing the number of transistors, and said decoding stage having a plurality of decoding outputs connected two by two with m-1 pass transistors, where m is the number of memory cells, and only one additional n-MOS transistor configured as a pull-down circuit for each of the outputs.

2. The architecture of claim 1 wherein a plurality of blocks of SRAM cells are connected upstream of said decoding stage, said memory cells being repeated as many times as a number of contexts.

3. The architecture of claim 2 wherein each line can be connected to one of the other wires n and m of said memory cells, where $m=k\lceil\log_2 n\rceil$, k is the number of contexts to be repeated, and n is the number of said routing lines in a routing channel.

4. The architecture of claim 2 wherein each of said SRAM cells comprises an n-MOS pass transistor for writing data and at least one other transistor for reading data, and a bistable element inserted between said n-MOS pass transistor and said another transistor for storing data.

5. The architecture of claim 2 wherein each SRAM cell can be written while another is being read.

6. The architecture of claim 4 wherein each SRAM cell comprises six transistors, five transistors thereof having a minimum size, and only the n-MOS pass transistor for writing purposes has a larger size.

7. A circuit architecture to implement connections between logic blocks and routing lines in reconfigurable gate arrays, comprising:

connection blocks to connect inputs and outputs of different logic elements by means of connection wires, wherein each connection block comprises a single line of pass transistor switches; and a decoding stage to drive said pass transistor switch;

a plurality of blocks of SRAM cells connecting upstream of said decoding stage, said SRAM cells repeated as many times as a number of contexts, each of said SRAM cells comprising an n-MOS pass transistor for writing data and at least one other transistor for reading data, and a bistable element inserted between said n-MOS pass transistor and said one other transistor for storing data; and a single level-shifter buffer provided at the end of the reading line to recover an electric threshold and to provide both true and complementary values to feed a following decoding stage.

8. A connection block for reconfigurable gate arrays to implement connections between logic blocks and routing lines, the connection block comprising:

a plurality of connection wires coupled to an output of the logic block and each wire coupled to a respective routing line, each wire including a single pass transistor switch having a control terminal; and a decoding stage having a plurality of outputs, each output coupled to the respective pass transistor switch control terminal to selectively couple the logic block to at least one of the routing lines, the decoding stage outputs coupled two-by-two with m-1 pass transistors, and only one additional n-MOS transistor configured as a pull-down circuit for each of the plurality of outputs.

9. The connection block of claim 8 wherein the decoding stage comprises a pull-up transistor network and a pull-down transistor network, the pull-up transistor network comprising a transistor tree.

10. The connection block of claim 9, comprising a plurality of SRAM cells connected to inputs of the decoding stage, each SRAM cell comprising an n-MOS pass transistor for writing data and at least one other transistor for reading data, and a bistable element inserted between the n-MOS pass transistor and the at least one other transistor for storing data.

11. The connection block of claim 10 wherein the connection block is configured so that each SRAM cell can be written while another SRAM cell is being read.

12. A memory architecture, comprising:

a plurality of SRAM memory cells, each SRAM memory cell comprising an n-MOS pass transistor for writing data, a further transistor for reading data, and a bistable element coupled between the n-MOS pass transistor and other transistor for storing data, the bistable element comprising a first inverter having an input coupled to the further transistor and an output coupled to the n-MOS pass transistor, and a second inverter having an input coupled to the n-MOS pass transistor and an output coupled to the further transistor;

at least one logic block;

a plurality of routing lines;

a connection block coupled between the at least one logic block and the plurality of routing lines, the connection block comprising a plurality of wires coupled to an output of the at least one logic block and each of the plurality of wires coupled to a respective routing line, the connection block further comprising a pass transistor switch in each connection wire for selectively coupling the at least one logic block to a respective routing line, the pass transistor switch including a control terminal;

a decoding stage having a plurality of decoding outputs, each decoding output coupled to the control terminal of their respective pass transistor switch to drive the pass transistor switch; and a single level-shifter buffer coupled to further transistor in the bistable element and configured to recover an electric threshold and to provide both true and complimentary values to be output to the decoding stage.

13. The memory architecture of claim 12 wherein each SRAM cell can be written while another is being read.

14. The architecture of claim 7 wherein each SRAM cell can be written while another is being read.

15. The architecture of claim 7 wherein each SRAM cell comprises six transistors, five transistors thereof having a minimum size, and only the n-MOS pass transistor adapted for writing purposes having a larger size.

16. A circuit architecture to implement connections between logic blocks and routing lines in multi-context reconfigurable gate arrays, comprising: connection blocks to connect inputs and outputs of different logic elements in a multi-context reconfigurable gate array by means of connection wires, wherein each connection block comprises a single line of pass transistor switches; and a decoding stage to drive said pass transistor switches; and a plurality of multi-context SRAM cells connected to the decoder inputs.

17. The architecture of claim 16 wherein the decoding stage is organized with a pull-up p-MOS transistor network and a n-MOS pull-down network, said pull-up transistor network comprising a p-MOS tree minimizing the number of transistors; and a plurality of decoding outputs being connected two by two with m-1 pass transistors, where m is the number of the memory cells, and only an additional n-MOS transistor configured as a pull-down circuit for each output.

18. The architecture of claim 16 wherein the decoding stage is configured to minimize the number of multi-context SRAM cells in each connection block to connect inputs and outputs of logic elements to connection wires.

19. The architecture of claim 17 wherein the decoder is adapted to minimize the number of transistors needed by the decoding stage in each connection block.

20. The architecture of claim 16 wherein the multi-context SRAM cell comprises k 6-transistor SRAM cells, where k is the number of contexts, wherein each said 6-transistor SRAM cell comprises an n-MOS pass transistor for writing data and one other transistor for reading data, and a bistable element inserted between said n-MOS pass transistor and said one other transistor for storing data; and a single level shifter buffer connected to the said k n-MOS read pass transistors to recover an electric threshold.

21. The architecture of claim 20 wherein one of the said 6-transistor SRAM cells corresponding to one context can be written while another, corresponding to a different context, is read.

22. The architecture of claim 20 wherein the single level shifter buffer is adapted to provide both true and complementary values to feed a following decoding stage.

23. The architecture of claim 21 wherein the multi-context SRAM cells are coupled upstream to inputs of the decoding stage.

* * * * *

UNITED STATES PATENT AND TRADEMARK OFFICE
CERTIFICATE OF CORRECTION

PATENT NO. : 7,193,437 B2 Page 1 of 1
APPLICATION NO. : 10/778913
DATED : March 20, 2007
INVENTOR(S) : Cappelli et al.

It is certified that error appears in the above-identified patent and that said Letters Patent is hereby corrected as shown below:

Column 10
Line 6, "connecting" should read as -- connected --

Signed and Sealed this

Seventeenth Day of June, 2008

JON W. DUDAS
*Director of the United States Patent and Trademark Office*